United States Patent [19]

Hashiguchi et al.

[11] Patent Number: 5,376,592
[45] Date of Patent: Dec. 27, 1994

[54] METHOD OF HEAT-TREATING A SEMICONDUCTOR WAFER TO DETERMINE PROCESSING CONDITIONS

[75] Inventors: Toshiya Hashiguchi; Hiroaki Yamagishi, both of Kanagawa, Japan

[73] Assignee: Sony Corporation, Tokyo, Japan

[21] Appl. No.: 5,299

[22] Filed: Jan. 19, 1993

[30] Foreign Application Priority Data

Jan. 21, 1992 [JP] Japan .................................. 4-029033

[51] Int. Cl.$^5$ ........................................... H01L 21/31
[52] U.S. Cl. .................................. 437/239; 437/247; 148/DIG. 3
[58] Field of Search .................. 437/247, 248, 239; 148/DIG. 3, DIG. 79

[56] References Cited

U.S. PATENT DOCUMENTS

| | | | |
|---|---|---|---|
| 4,214,919 | 7/1980 | Young | 148/1.5 |
| 4,784,975 | 11/1988 | Hofmann et al. | 437/247 |
| 5,210,056 | 5/1993 | Pong et al. | 437/239 |

FOREIGN PATENT DOCUMENTS 53-105975  9/1978  Japan .................................. 437/247

*Primary Examiner*—Olik Chaudhuri
*Assistant Examiner*—Ken Horton
*Attorney, Agent, or Firm*—Hill, Steadman & Simpson

[57] ABSTRACT

A method of heat-treating a semiconductor wafer comprises: heat-treating a semiconductor wafer in an atmosphere of an inert gas which does not absorb infrared rays in a specific infrared region to determine heat-treating conditions that heat the semiconductor wafer in a desired temperature profile; and heat-treating a semiconductor wafer in an atmosphere of a process gas according to the previously determined heat-treating conditions. Since the inert gas used in predetermining the heat-treating conditions does not absorb infrared radiation in the specific infrared region corresponding to the infrared absorption range of the process gas, the temperature of the semiconductor wafer can be accurately measured by a pyrometer to determine the heat-treating conditions. In the practical heat treatment of a semiconductor wafer, the temperature of a semiconductor wafer can be accurately controlled according to the predetermined heat-treating conditions.

2 Claims, 2 Drawing Sheets

METHOD OF HEAT-TREATING A SEMICONDUCTOR WAFER TO DETERMINE PROCESSING CONDITIONS

BACKGROUND OF THE INVENTION

1. Field of the Invention

The present invention relates to a method of heat-treating a semiconductor wafer and, more specifically, to improvements in a method of heat-treating a semiconductor wafer, using a gas capable of absorbing infrared radiation in a specific infrared region as a process gas.

2. Description of the Prior Art

A lamp type heating device provided with a tungsten lamp or a halogen lamp as a light source for the rapid infrared heating of a semiconductor wafer is used for manufacturing semiconductor devices. Generally, the temperature of a wafer is measured by a pyrometer when heating the wafer with such a heating device. Most pyrometers use a long monitoring wavelength in the range of 4 to 5 $\mu$m to measure temperatures in a low temperature range of 300° to 400° C.

The enhancement of the reliability of a very thin $SiO_2$ film of a thickness in the range of 5 to nm is essential to form VLSIs and ULSIs of a high degree of integration. Such a very thin $SiO_2$ film of high reliability is important particularly in forming floating gate memories, such as EPROMs, EEPROMs and flash memories. A process for the thermal nitriding of a $SiO_2$ film in a $NH_3$ atmosphere has been studied to enhance the reliability of the $SiO_2$ film. However, when the $SiO_2$ film is processed in a $NH_3$ atmosphere for thermal nitriding, the breakdown characteristics of the $SiO_2$ film are deteriorated greatly. Such a nitrided $SiO_2$ film is unreliable for long-term use.

To solve such a problem a highly reliable $N_2O$-nitrided $SiO_2$ film having few traps has been proposed in, for example, H. Fukuda, et al., "Highly Reliable Thin Nitrided $SiO_2$ Films Formed by Rapid Thermal Processing in an $N_2O$ Ambient", Extended Abstracts of 1990 International Conference on Solid State Devices and Materials, pp.159, 1990. This $N_2O$-nitrided $SiO_2$ thin film can be obtained by subjecting a $SiO_2$ thin film to, for example, RTA (rapid thermal annealing) in a nitrogen monoxide ($N_2O$) gas atmosphere.

When $N_2O$ gas is employed as a process gas, it is impossible to measure the temperature of the wafer accurately, because $N_2O$ gas has an infrared absorption peak in the wavelength range of 4.5 to 5.0 $\mu$m as shown in FIG. 1, which is a quotation from H.L. Hackfold, "Sekigaisen Kogaku", Kindai Kagaku She, Oct. 1, 1963, pp. 54 and 66.

FIG. 2 is a graph showing the variation of the output of the pyrometer with time when a wafer was heated at a constant temperature in a heating chamber, and $N_2$ gas and $N_2O$ gas were supplied alternately into the heating chamber at a cycle time of 20 sec. The monitoring wavelength of the pyrometer was 4.7 $\mu$m. As is obvious from FIG. 2, the output of the pyrometer is stabilized on a level corresponding to abut 1050° C. while $N_2$ gas is supplied into the heating chamber, whereas the output of the pyrometer is reduced to levels corresponding respectively to about 780° C. and 720° C., which are lower than the temperature corresponding to the level of the output of the pyrometer when $N_2$ gas is supplied into the heating chamber by about 300° C., while $N_2O$ gas is supplied into the chamber, due to the absorption of infrared radiation emitted by the wafer by the $N_2O$ gas. Whereas the outputs of the pyrometer in the first and second $N_2$ gas supply cycles are substantially equal to each other, the difference between the output of the pyrometer in the first $N_2O$ gas supply cycle indicating about 720° C. and that of the same in the second $N_2O$ gas supply cycle indicating about 780° C. is about 60° C., which is inferred to be due to the variation of the temperature of the $N_2O$ gas.

It is obvious from FIG. 2 that it is quite difficult to measure the temperature of the wafer by the pyrometer using a monitoring wavelength of 4.7 $\mu$m when $N_2O$ gas is used as a process gas, because infrared radiation emitted by the wafer are absorbed by the $N_2O$ gas and the absorption of the infrared radiation by the $N_2O$ gas is dependent on the temperature of $N_2O$ gas.

As shown in FIG. 1, similar difficulty occurs when a process gas of triatomic molecules having an infrared absorption band corresponding to the infrared region of 4.5 to 5.0 $\mu$m, such as steam, carbon dioxide gas ($CO_2$ gas) or ozone, is used instead of $N_2O$ gas.

SUMMARY OF THE INVENTION

Accordingly, it is an object of the present invention to provide a method of heat-treating a semiconductor wafer, capable of solving the problem that it is difficult to control the temperature of a semiconductor wafer on the basis of the output of a pyrometer in fabricating a semiconductor device on the semiconductor wafer by using a process gas having an infrared absorption band in a specific infrared range because of the difference between the actual temperature of the semiconductor wafer and a temperature represented by the output of the pyrometer.

In one aspect of the present invention, a method of heat-treating a semiconductor wafer comprises:

(a) heat-treating a semiconductor wafer in an atmosphere of an inert gas which does not absorb infrared radiation in a specific infrared region to determine heat-treating conditions that heat a semiconductor wafer in a desired temperature profile; and (b) heat-treating the semiconductor wafer in an atmosphere of a process gas according to the predetermined heat-treating conditions.

The process gas having an infrared absorption band corresponding to the wavelength range of 4.5 to 5.0 $\mu$m may be $N_2O$ gas, steam, $CO_2$ gas or ozone. The inert gas may be $N_2$ gas, argon gas (Ar gas) or a mixture of some of those gases.

Since the inert gas used in predetermining heat-treating conditions does not absorb infrared radiation in the specific infrared region corresponding to the infrared absorption range of the process gas, the temperature of the semiconductor wafer can be accurately measured by a pyrometer to determine the heat-treating conditions accurately. Since the heat-treating process is controlled according to the predetermined heat-treating conditions, the temperature of the semiconductor wafer can be accurately controlled without using any pyrometer.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

A semiconductor wafer having a surface coated with a $SiO_2$ film of 10 nm in thickness formed by thermal oxidation was used as a test specimen. The semiconductor wafer was subjected to heat treatment on a rapid thermal apparatus, i.e., heat treating apparatus, provided with a halogen lamp. The semiconductor wafer was heated in a $N_2$ gas atmosphere so that the temperature of the semiconductor wafer varies in a desired temperature profile to determine a heat-treating condition for heating the semiconductor wafer in such a mode. The temperature of the semiconductor wafer was measured by a pyrometer using a monitoring wavelength of 4.7 $\mu$m. Infrared radiation of a wavelength equal to the monitoring wavelength of 4.7 $\mu$m are not absorbed by $N_2$ gas.

Power, i.e., the heat-treating condition, supplied to the halogen lamp of the rapid thermal apparatus to heat the semiconductor wafer, for example, at 1000° C. for sixty seconds, which is the desired temperature profile, was measured while the temperature of the semiconductor wafer was measured by the pyrometer. When subjecting a semiconductor wafer to heat treatment in a $N_2O$ gas atmosphere, the semiconductor wafer is heated under the thus predetermined heat-treating condition.

Generally, the monitoring wavelength used by the pyrometer is determined by a filter disposed in front of the pyrometer. The rapid thermal apparatus is able to measure the temperature of the semiconductor wafer by using a plurality of monitoring wavelengths if the same is provided with a plurality of pyrometers provided respectively with filters differing from each other in transmission wavelength or with a single pyrometer and a plurality of filters capable of being selectively combined with the pyrometer.

Figure 1:
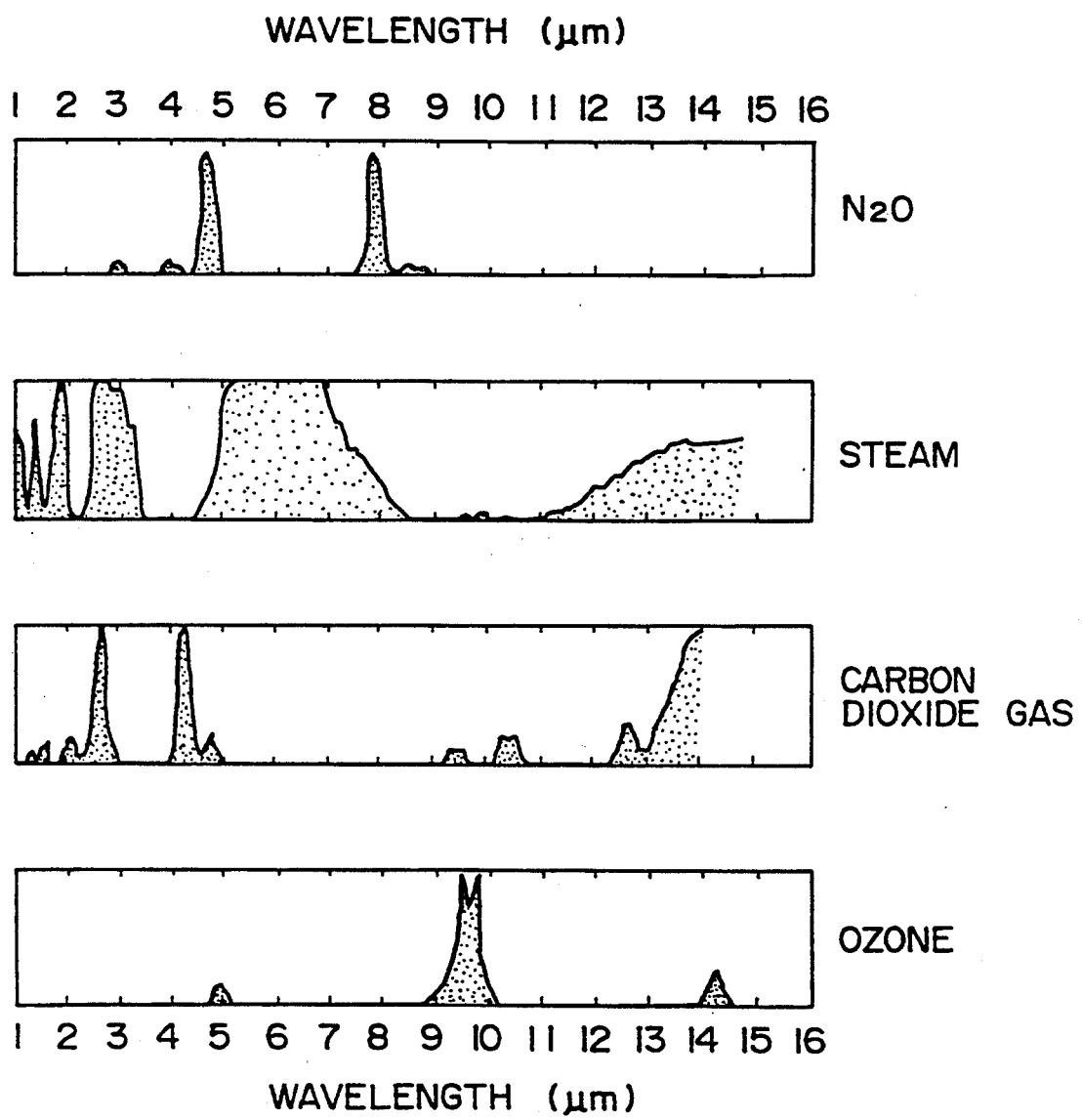
FIG. 1 is infrared absorption spectra obtained by passing infrared radiation through $N_2O$ gas, steam, $CO_2$ gas and ozone.
Figure 2:
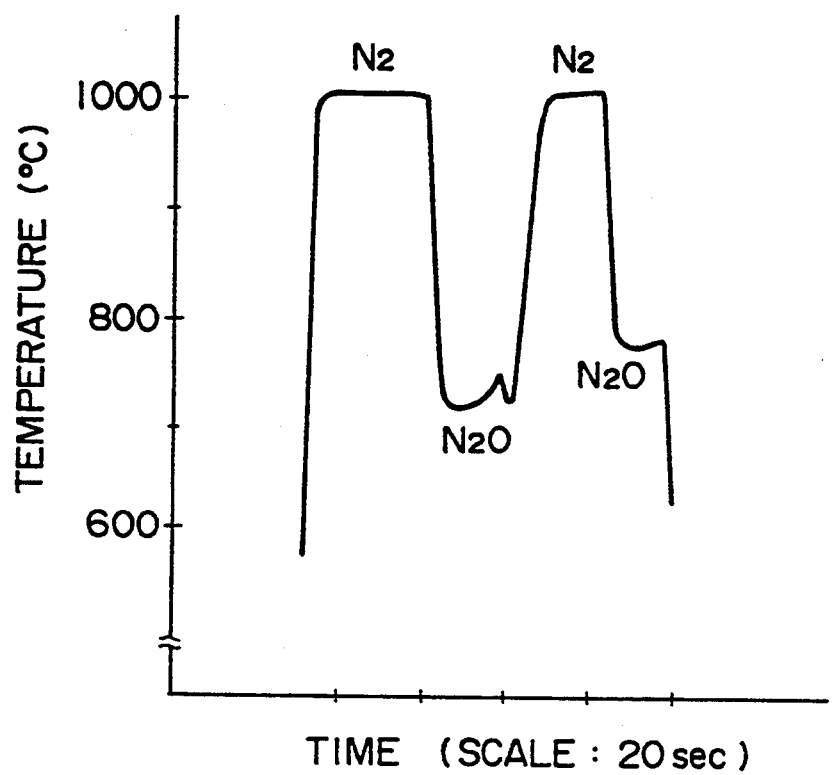
FIG. 2 is a graph showing the variation of the output of a pyrometer using a monitoring wavelength of 4.7 $\mu$m represented by corresponding temperature with time in measuring the temperature of a semiconductor wafer heated at a constant temperature in a heating chamber by alternately supplying $N_2O$ gas and $N_2$ gas into the heating chamber.
Figure 3:
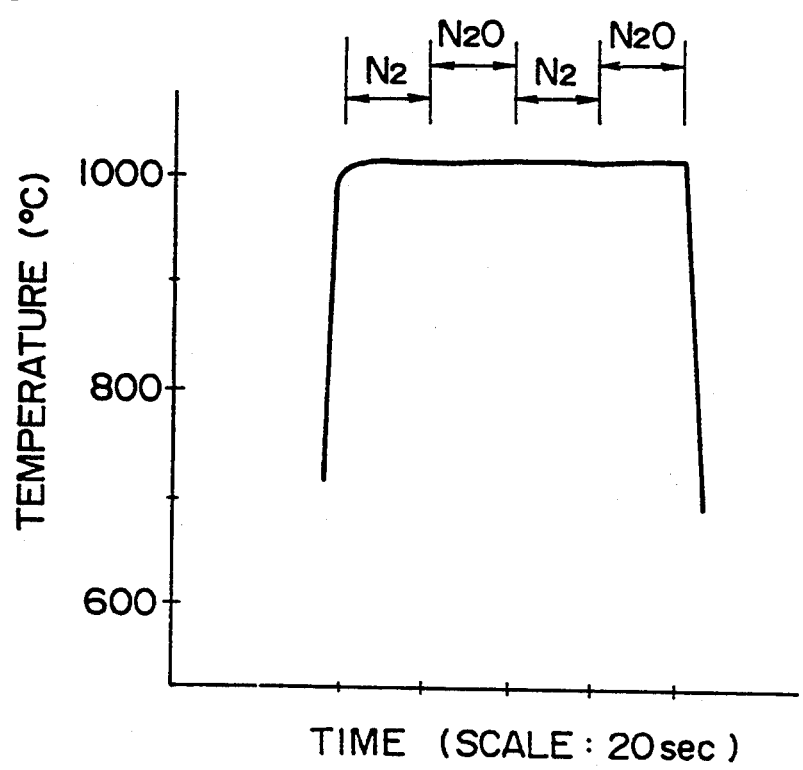
FIG. 3 is a graph showing the variation of the output of a pyrometer using a monitoring wavelength of 3.2 $\mu$m represented by corresponding temperature with time in measuring the temperature of a semiconductor wafer heated at a constant temperature in a heating chamber by alternately supplying $N_2O$ gas and $N_2$ gas in to the heating chamber.

As is obvious from FIG. 1, $N_2O$ gas does not absorb infrared radiation of wavelengths in the 3.2 $\mu$m infrared region. The dependence of the temperature measuring performance of the pyrometer using a monitoring wavelength of 3.2 $\mu$m on $N_2O$ gas and $N_2$ gas was examined by measuring the output of the pyrometer when $N_2O$ gas and $N_2$ gas were used alternately at a cycle time of 20 sec. As is obvious from FIG. 3, the output of the pyrometer is stable on a constant level corresponding to 1000° C. even though $N_2O$ gas and $N_2$ gas were used alternately; that is, infrared radiation of wavelengths in the 3.2 $\mu$m infrared region emitted by the semiconductor wafer are not absorbed by $N_2O$ gas. Accordingly, the temperature of the semiconductor wafer heated in a $N_2O$ gas atmosphere measured by the pyrometer is substantially equal to that of the same heated in a $N_2$ gas atmosphere measured by the same pyrometer.

The reliability of the output of the pyrometer using a monitoring wavelength of 3.2 $\mu$m was examined through the experimental heat treatment of the semiconductor wafer in a $N_2O$ gas atmosphere. The experimental heat treatment of the semiconductor wafer was controlled on the basis of the output of the pyrometer representing the temperature of the semiconductor wafer to see if the semiconductor wafer is heated in the desired temperature profile when the semiconductor wafer is heat-treated according to the output of the pyrometer. The experimental heat treatment proved that the temperature profile of the semiconductor wafer when heat-treated in a $N_2O$ atmosphere according to the output of the pyrometer is the same as that of the semiconductor wafer heat-treated in a $N_2$ atmosphere, provided that the power supplied to the halogen lamp of the rapid thermal apparatus is constant.

The method of heat-treating a semiconductor wafer of the present invention may be carried out by a heat-treating apparatus provided with a pyrometer other than the rapid thermal apparatus. It is possible to use, as an inert gas, Ar gas or a mixture of these gases instead of $N_2$ gas. A triatomic molecule gas, such as steam, $CO_2$ gas or ozone, may be used as a process gas instead of $N_2O$ gas.

As shown in FIG. 1, steam has a wide infrared absorption band. Therefore, a pyrometer using a monitoring wavelength in the range of 3.5 to 4.5 $\mu$m corresponding to an infrared absorption window in the infrared absorption band of steam, i.e., an infrared region infrared radiation of wavelengths in which are not absorbed by steam, is needed when steam is used as a process gas. Steam does not absorb infrared radiation of wavelengths in an infrared region around 2.1 $\mu$m and in an infrared region around 9 to 11 $\mu$m. However, a pyrometer using a monitoring wavelength around 2.1 $\mu$m is unable to measure temperatures in a low temperature range, and a pyrometer using a monitoring wavelength in the range of 9 to 11 $\mu$m is practically unable to measure temperature accurately. Accordingly, it is desirable to use a pyrometer capable of selectively using a plurality of monitoring wavelengths including a monitoring wavelength in the range of 3.5 to 4.5 $\mu$m depending on the type of a process gas to be used.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of heat-treating a semiconductor wafer, comprising:
   (a) heat-treating a semiconductor wafer in an atmosphere of an inert gas of symmetrical molecules which does not absorb infrared radiation in a specific infrared region corresponding to an infrared absorption range of a process gas;
   (b) simultaneously measuring a temperature of the semiconductor wafer by sensing emissions in specific infrared region to determine heat-treating conditions that heat the semiconductor wafer in a desired temperature profile; and (c) heat-treating semiconductor wafers in an atmosphere of said process gas of triatomic molecules according to the previously determined heat-treating conditions.

2. A method of heat-treating a semiconductor wafer according to claim 1, wherein said process gas of triatomic molecules is $N_2O$ gas, $CO_2$ gas, steam or ozone, and said inert gas is $N_2$ gas, Ar gas or a mixture of these gases.

* * * * *